United States Patent
Meaney et al.

(10) Patent No.: US 7,275,224 B2
(45) Date of Patent: Sep. 25, 2007

(54) METHOD FOR PROVIDING AN AREA OPTIMIZED BINARY ORTHOGONALITY CHECKER

(75) Inventors: Patrick J. Meaney, Poughkeepsie, NY (US); Alan P. Wagstaff, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 10/817,279

(22) Filed: Apr. 2, 2004

(65) Prior Publication Data

US 2005/0228910 A1  Oct. 13, 2005

(51) Int. Cl.
*G06F 17/50* (2006.01)
*H04J 11/00* (2006.01)
*G06F 13/00* (2006.01)
*G06F 3/00* (2006.01)
*G06F 15/173* (2006.01)

(52) U.S. Cl. .................. 716/2; 716/7; 716/8; 370/203; 710/33; 710/36; 709/238

(58) Field of Classification Search ............ 716/4, 716/2, 5, 7, 12, 18; 710/104, 316, 33, 36; 326/39, 41; 370/535, 203; 709/238
See application file for complete search history.

(56) References Cited

U.S. PATENT DOCUMENTS

| | | | | |
|---|---|---|---|---|
| 4,410,989 A | * | 10/1983 | Berlekamp | 714/762 |
| 4,775,852 A | * | 10/1988 | Sloane | 341/118 |
| 5,189,629 A | * | 2/1993 | Kohnen | 716/2 |
| 5,257,201 A | * | 10/1993 | Berman et al. | 716/2 |
| 5,631,915 A | * | 5/1997 | Meaney et al. | 714/763 |
| 5,745,373 A | * | 4/1998 | Watai et al. | 716/12 |
| 5,774,481 A | * | 6/1998 | Meaney et al. | 714/763 |
| 5,996,040 A | * | 11/1999 | Meaney et al. | 710/316 |
| 6,038,626 A | * | 3/2000 | Meaney et al. | 710/104 |
| 6,063,132 A | * | 5/2000 | DeCamp et al. | 716/5 |
| 6,212,669 B1 | * | 4/2001 | Jain | 716/7 |
| 6,269,467 B1 | * | 7/2001 | Chang et al. | 716/1 |
| 6,421,810 B1 | * | 7/2002 | McCown | 716/4 |
| 6,426,939 B1 | * | 7/2002 | Moon et al. | 370/203 |
| 6,437,598 B1 | * | 8/2002 | Zhou | 326/39 |
| 6,587,990 B1 | * | 7/2003 | Andreev et al. | 716/2 |
| 6,721,926 B2 | * | 4/2004 | Wang et al. | 716/2 |
| 7,028,278 B2 | * | 4/2006 | Jain | 716/5 |
| 2004/0131011 A1 | * | 7/2004 | Sandell et al. | 370/210 |
| 2005/0129071 A1 | * | 6/2005 | Boerstler et al. | 370/535 |
| 2005/0146352 A1 | * | 7/2005 | Madurawe | 326/41 |

* cited by examiner

Primary Examiner—Phallaka Kik
(74) Attorney, Agent, or Firm—Lynn L. Augspurger

(57) ABSTRACT

A method for minimizing the area of a binary orthogonality checker implemented in static CMOS circuits for minimizing the gate count and area needed for checker implementation. The method is adaptable to various libraries of logical gates to implement the circuit and the area for each gate in the library. The optimal mix of hierarchical levels and stages is determined such that the orthogonality checker achieves the minimized circuit area. An orthogonality checker is employed in a scalable selector system for controlling data transfers and routing in a data processing system to allow. Combining orthogonality checking with existing selector hierarchically allows for the maximum reuse of circuits, signals, and proximity; thus potentially reducing wiring as well. Multiple hierarchical checks are used in favor of one large. This structure is extended to multiple hierarchical levels and works with orthogonality checks of any size or implementation. The invention also determines the optimal hierarchical structure for a given technology library and a given number of inputs to check. It can also be used within a flat hierarchy or macro as a technique to reduce circuits.

10 Claims, 4 Drawing Sheets

| INPUTS | NUMBER OF ANDs | NUMBER OF ORs | TOTAL GATES |
|---|---|---|---|
| 2 | 1 | 0 | 1 |
| 3 | 3 | 2 | 5 |
| 4 | 6 | 5 | 11 |
| 5 | 10 | 9 | 19 |
| 6 | 15 | 14 | 29 |
| 7 | 21 | 20 | 41 |
| 8 | 28 | 27 | 55 |
| 9 | 36 | 35 | 71 |
| 10 | 45 | 44 | 99 |
| 11 | 55 | 54 | 109 |
| 12 | 66 | 65 | 131 |
| 13 | 78 | 77 | 155 |
| 14 | 91 | 90 | 181 |
| 15 | 105 | 104 | 209 |
| 16 | 120 | 119 | 239 |

- $\text{ORTH}(A,B,C,D) = AB+AC+AD+BC+BD+CD$

- $= AB+CD+AC+AD+BC+BD$

- $= AB+CD+(A+B)(C+D)$

- $= \text{ORTH}(A,B)+\text{ORTH}(C,D)+\text{ORTH}(A+B,C+D)$

FIG.4

| CELLNAME | WIDTH | NORMALIZED AREA |
|---|---|---|
| INV | 22.5 | 2.5 |
| NAND2 | 27 | 3 |
| NAND3 | 36 | 4 |
| NAND4 | 45 | 5 |
| NOR2 | 27 | 3 |
| NOR3 | 36 | 4 |

FIG.5

| INPUTS | NUMBER OF ANDs | NUMBER OF ORs | TOTAL GATES | NUMBER OF ORTH2 | NUMBER OF ORTH3 | ADDITIONAL OR2's | NEW TOTAL GATES | SAVINGS (IN GATES) |
|---|---|---|---|---|---|---|---|---|
| 2 | 1 | 0 | 1 | | | 0 | 1 | 0 |
| 3 | 3 | 2 | 5 | 1 | | 0 | 5 | 0 |
| 4 | 6 | 5 | 11 | | 1 | 4 | 7 | 4 |
| 5 | 10 | 9 | 19 | 3 | | 5 | 12 | 7 |
| 6 | 15 | 14 | 29 | 2 | 1 | 6 | 14 | 15 |
| 7 | 21 | 20 | 41 | 3 | 1 | 10 | 16 | 25 |
| 8 | 28 | 27 | 55 | 6 | 0 | 12 | 19 | 36 |
| 9 | 36 | 35 | 71 | 7 | 1 | 14 | 26 | 45 |

FIG.6

| INPUTS | TOTAL GATES (OLD STYLE) | TOTAL GATES (NEW STYLE) | TOTAL AREA (OLD STYLE) | TOTAL AREA (NEW STYLE) | SAVINGS (IN GATES) | SAVINGS (IN AREA) |
|---|---|---|---|---|---|---|
| 4 | 4 | 3 | 22 | 15 | 1 | 7 |
| 6 | 12 | 14 | 61 | 45 | -2 | 16 |
| 8 | 23 | 19 | 116 | 66 | 4 | 50 |
| 10 | 36 | 26 | 185 | 90 | 10 | 95 |

FIG.7

METHOD FOR PROVIDING AN AREA OPTIMIZED BINARY ORTHOGONALITY CHECKER

CROSS-REFERENCE TO RELATED APPLICATIONS

TRADEMARKS

IBM® is a registered trademark of International Business Machines Corporation, Armonk, N.Y., U.S.A. S/390, Z900 and z990 and other names used herein may be registered trademarks, trademarks or product names of International Business Machines Corporation or other companies.

BACKGROUND OF THE INVENTION

1. Field of the Invention

This invention relates to minimizing the area of a binary orthogonality checker implemented in static CMOS circuits.

2. Description of Background

This invention relates to minimizing the area of a binary orthogonality checker implemented in static CMOS circuits. Binary orthogonality checkers are used in static CMOS logic to check the control inputs to an orthogonal selector, ensuring there is no data collision between inputs. The checker guarantees that no more than one input to the checker has a true logical value during any comparison cycle. Since the primary purpose of the circuit is a checker, the primary concern for the circuit is to reduce the area the checker uses to complete the function. Within IBM, orthogonality checkers compared each combination of inputs with an AND gate, and then ORed all the outputs (see FIG. 1.) Thus as described in IBM Patent U.S. Pat. Nos. 5,996,040 and 6,038,626 an orthogonality checker was employed in a scalable selector system for controlling data transfers and routing in a data processing system, comprising a plurality of input data buses coupled to a multiple-bit, multiple bus selector having data, data valid, and an orthogonality check outputs and having multiple data input bus ports coupled for receipt of signal from said plurality of input data buses. The system of U.S. Pat. No. 5,996,040 used a multiplicity of said input data buses provide input controls to said multiple-bit, a multiple bus selector to produce a single output data bus signal on a data output bus, and a data valid signal as a control output. The orthogonality check signal controlled data routing logic to allow dataflow to be connected and reconnected without change to control logic. As will be described, for a generalized N input checker completed with a library of gates the solution grows by the squared number for N gates, and thus takes N squared area to implement. As the size of a prior art orthogonality checker grows with the square of the number of inputs, orthogonality checkers with a small number of inputs have a small size. It would be desirable to have a hierarchical checking structure that could be implemented with a smaller area, as well as one which had a smaller logic growth rate as the number of gates increased.

SUMMARY OF THE INVENTION

This invention provides a way for minimizing the area of a binary orthogonality checker implemented in static CMOS circuits. The area and logic growth rate of the prior art can be reduced by creating an internal hierarchical checking structure. In accordance with our preferred embodiment we have provided a method for minimizing the gate count and area needed to implement an orthogonality checker given a library of logical gates to implement the circuit and the area for each gate in the library. In accordance with our improvement we have provided for determining the optimal mix of hierarchical levels and inputs to implement a given orthogonality checker to achieve the minimized circuit. An orthogonality checker was employed in a scalable selector system for controlling data transfer and routing in a data processing system, comprising a plurality of input data buses coupled to a multiple-bit, multiple bus selector having data, data valid, and orthogonality check outputs and having multiple data input bus ports coupled for receipt of signal from said plurality of input data buses. for providing binary orthogonality checking by hierarchically combining the checks with smaller numbers of inputs, so that the total check of a large number of inputs is performed with less gates and in a smaller area. In accordance with our preferred embodiment we combine multiple checks into one larger check, providing that the check is performed on each input set, as well as combining an OR of all the inputs to the check. The resulting OR values are then checked for orthogonality, and the results of all the checks are ORed together (see FIG. 3.) This structure is extended to multiple hierarchical levels and works with orthogonality checks of any size or implementation. The invention also determines the optimal hierarchical structure for a given technology library and a given number of inputs to check.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3A illustrates one N=6 example of a hierarchical orthogonality checker, while

FIG. 4 illustrates one example of Boolean equivalence of flat and hierarchical orthogonality checking.

FIG. 5 illustrates one example of a library table with area, taken from TSMC .25 MOSIS Library.

FIG. 6 illustrates the results of computations with a library of 2 input gates.

FIG. 7 illustrates the results of synthesis runs with access to a full standard cell library.

Figures 1, 2:
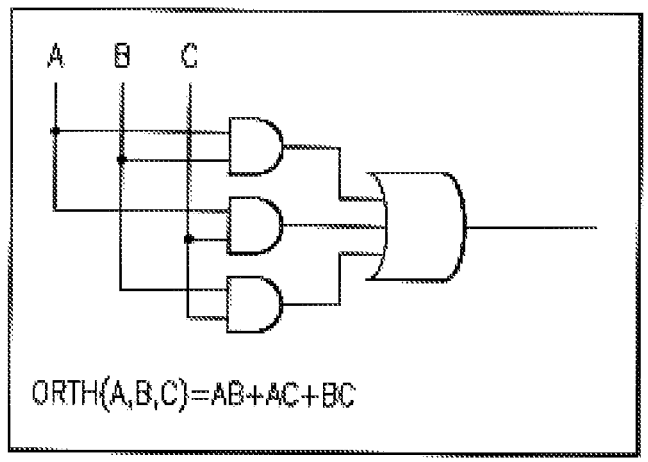
FIG. 1 illustrates the prior art for an orthogonality checker. The logic ANDs each combination of inputs, then ORs each of the resulting outputs together to produce the final error signal.
FIG. 2 illustrates a table of the number of two input gates necessary to implement an N input orthogonality checker.

The detailed description explains the preferred embodiments of the invention, together with advantages and features, by way of example with reference to the drawings.

DETAILED DESCRIPTION OF THE INVENTION

To minimize the area of the orthogonality checker, this method minimizes the total gate count necessary to implement the orthogonality logic. This minimization is achieved through implementing the orthogonality logic in a hierarchical structure. This method shows the area benefit of the hierarchical structure and identifies the optimal structure for any static CMOS library.

The basic orthogonality function identifies if two or more binary signals in a group have a logical true value. The IBM system described in the background compared every combination of two signals in the group and performed a logical OR on each of the outputs. While correct, this produces a structure of $$\frac{N(N-1)}{2} + \left(\frac{N(N-1)}{2}\right) - 1 = N(N-1) - 1$$

two input gates. As the number of inputs, N, gets larger, this number grows with N squared. By dividing a set of signals into two, or more groups, the orthogonality of the total set can be determined by: determining the orthogonality of each group individually, forming a new group of the OR value of each group, determining the orthogonality of the new group, and producing the final output by ORing each of the resulting orthogonality signals. For example, let N=6, calling the inputs a, b, c, d, e, and f (see FIG. 3.) First, the signals are divided into two groups each of size N=3, call them group 1, containing a, b, and c, and group 2, containing d, e, and f. For group 1 two values are found. First $G_1$, equal to the orthogonality or the three signals in group 1, and $O_1$, equal to the OR of the three signals in group 2. Then the same signals are computed for group 2, resulting in $G_2$ and $O_2$. A new group, group 3, is formed from all the $O_n$, signals available, and the orthogonality is formed into $G_3$. The orthogonality of the entire group, a, b, c, d, e, and f is equal to the OR of $G_1$, $G_2$, and $G_3$ (see FIG. 4). Using a library of 2 input AND and OR gates, the prior implementation contains 29 gates, while the new structure contains 17 gates.

The prior implementation generalized to an N input checker, it will have one AND gate for each combination of two inputs, or $$\binom{N}{2} = \frac{N*(N-1)}{2}$$

AND gates. This will be followed by an OR gate with the same number of inputs. Assuming the implementation can be completed with a library of gates consisting of only two input AND and two input OR gates, the size of the final solution takes $$\frac{N(N-1)}{2} + \left(\frac{N(N-1)}{2}\right) - 1 = N(N-1) - 1$$

gates. This solution grows with N squared gates, and thus N squared area (see FIG. 2.) The binary orthogonal checker by breaking the total circuit into groups allows the total number of gates needed to be reduced and is quite an improvement.

To determine the ideal hierarchical structure, the following analysis is necessary. First determine the point when a hierarchical structure is smaller than the prior art structure. For example, with a library of 2 input AND and OR gates, with 4 inputs, the prior art checking structure uses 11 gates, while the hierarchical structure uses only 8 gates. The next step in the method is to determine the optimal mix of ORTH2 and ORTH3 checks to combine to make the hierarchical checker. To determine this, examine the trade off of replacing two ORTH3 circuits with three ORTH2 circuits. The cost of the trade equals 2*(ORTH(3)+OR(3))−3*(ORTH(2)+OR(2)). The savings you gain by doing this equals (ORTH(J)−ORTH(J−1))+(OR(J+1)−OR(J)), where J is the number of output signals at the next level of hierarchy, and ORTH(N) is the cost of the orthogonality circuit with N inputs, OR(N) is the cost of the or circuit with N inputs. For this library the cost is equal to the number of 2 input gates necessary to implement the circuit. To substitute multiple groups of circuits, we find the total cost equals the original cost function multiplied by the number of groups substituted. The total savings from multiple substitutions equals (ORTH(J)−ORTH(J−M))+(OR(J+1)−OR(J+1−M)), where M is the number of substitutions. The optimal implementation for a hierarchical orthogonality checker is one that maximizes the value of savings minus cost. This can be determined for any orthogonality checker and library using a spreadsheet of values and building valid values.

For a CMOS library consisting of NAND, NOR, and INV gates, the basic theory from the previous library holds, however, the sizes of each function must be computed based on the area of the standard cells necessary to complete the function. Also in this library the functions can be optimized to reduce the number of inverters necessary.

From the Table of FIG. 2, we can determine the number of two input gates necessary to implement an N input orthogonality checker.

Figure 3A:
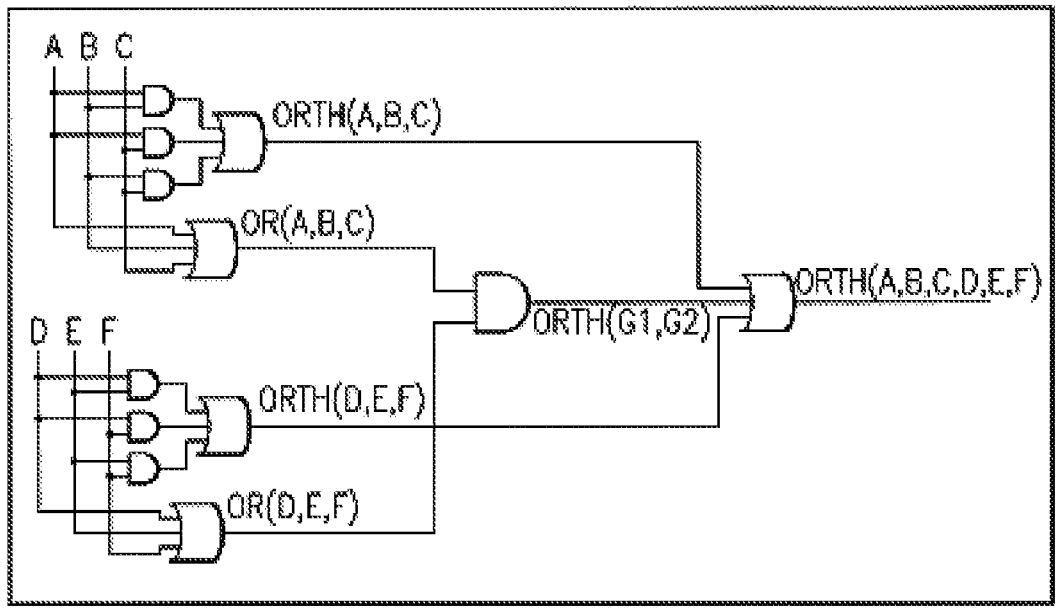

FIG. 3 illustrates one example of a hierarchical orthogonality checker. In this example of our preferred embodiment we have determined that the number of gates needed for N=6. By breaking the total circuit into groups the total number of gates deeded can be reduced. In the Example of FIG. 3, N=6, and we form two groups of three gates with ORTH(A,B,C) and ORTH(D,E,F). Each groups check is smaller. With OR(A,B,C) and OR(D,E,F) to produce the final result, the orthogonality of the Ors for each group is checked. The final orthogonality is the OR (ORTH(G1,G2) of the output of each orthogonality check which is the input produced for ORTH(A,B,C,D,E,F).

From this generalization, in the case of N=6, we note we need seven 2-1 AND gates, and five 3-1 OR gates of a total of 7+5*(3-1) area units, which is equal to 17 area units, a number much smaller than the 29 needed without employing the method of grouping.

FIG. 4 illustrates one example of Boolean equivalence of flat and hierarchical orthogonality checking of the groups ORTH(A,B,C,D) groups, showing ORTH(A+B,C+D).

FIG. 5 illustrates an example of a library table with area, taken from TSMC .25 MOSIS Library.

FIG. 6 illustrates the results of computations with a library of 2 input gates.

FIG. 7 illustrates the results of synthesis runs with access to a full standard cell library.

We can generalize by first determined that ORTH# is the size of an orthogonality check of #inputs, and we provide OR# as the size of an OR gate with # inputs. Then ORTH2+OR2=1+1=2. ORTH3+OR3=3+3+(3−1))+3−1=7. ORTH4+OR4=(6+(6−1))+(4−1)=14. This illustrates a succession of determinations, and the process can continue for the determined number of gates. We note, interesting that since the hierarchical ORTH4+OR4 contains 8 gates, ORTH4 should never be used.

Figure 3B:
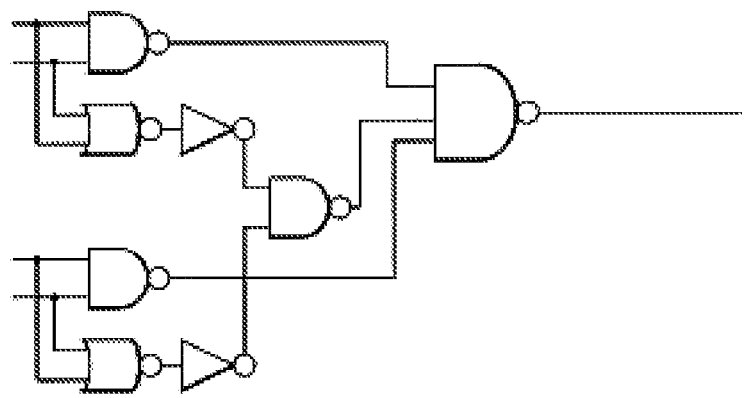
FIG. 3B shows a NAND implementation.

Here we should note that the illustrations relating to AND gates can be implemented for NAND gates, equivalent to the circuit of FIG. 3, where a NAND would be implemented for the illustrated AND gate, a NOR for the illustrated OR gate, with the output of the NOR inverted to a final NAND gate. This is equivalent to the circuit of FIG. 3, and shown as FIG. 3B.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for providing an area optimized binary orthogonality checker comprising the steps of:

determining a logical gate count for an implementation of an optomized orthogonality checker for a scalable selector system for controlling data transfers and routing in a data processing system; and minimizing the logical gate count and an implementation of said orthogolality checker given a library of logical gates to implement a minimized circuit, and while, given an area for each logical gate in the library, to optimize an hierarchical orthogonality structure for a hierarchical design of said circuit while maintaining said hierarchical design for said circuit.

2. The method according to claim 1 including the steps of: establishing an optimal mix of hierarchical level; and determining inputs to implement said orthogonality checker for said minimized circuit.

3. The method according to claim 1, where the area of said orthogonality checker is implemented in static CMOS circuits by minimizing the logical gate count and an area needed for checker implementation given a library of logical gates to implement the circuit and the area of each gate in the library.

4. The method according to claim 3, including a step of establishing an optimal mix of hierarchical levels and inputs to implement said orthogonality checker to achieve said minimized circuit.

5. The method according to claim 4 wherein said orthogonality checker is employed in a scalable selector system for controlling date transfers and routing in a data processing system, comprising a plurality of input data buses coupled to a multiple-bit, multiple bus selector having data, data valid, and an outputs of orthogonality checker and having multiple data input bus ports coupled for receipt of signal from said plurality of input data buses.

6. A method employed in a data processing system having a plurality of input data buses coupled to a multiple-bit, multiple bus selector having data, data valid, and outputs of an orthogonality checker and having multiple data input bus ports coupled for receipt of signal from said plurality of input data buses comprising the steps of:

establishing an expected number for a logical gate count of an implementation of an orthogonality checker, and providing binary orthogonality checking by hierarchically combining the outputs of said orthogonality checker with smaller numbers of inputs and by performing a total check of a large number of inputs with less gates and in a smaller area.

7. The method according to claim 6 wherein after determining an expected number for the logical gate count, then multiple checks of said orthogonal checker, are combined with reduced input sets into one larger check and said orthogonality checking is performed, with a check on each input set, as well as with combining an OR of all the inputs for providing resulting OR values to the one larger check.

8. The method according to claim 7 wherein the resulting OR values are then checked for orthogonality, and results of all the checks are Ored together.

9. The method according to claim 8 wherein said orthogonality checker is extended to multiple hierarchical levels and works with orthogonality checks for an extended size of implementation.

10. The method according to claim 9 wherein the orthogonality checker has an optimal hierarchical structure for a given technology library and a given number of inputs to check.

* * * * *